(12) United States Patent
Lim et al.

(10) Patent No.: US 9,548,034 B2
(45) Date of Patent: Jan. 17, 2017

(54) DISPLAY DEVICE AND METHOD OF DRIVING THE SAME

(71) Applicant: SAMSUNG DISPLAY CO., LTD., Yongin, Gyeonggi-do (KR)

(72) Inventors: Ji Hun Lim, Goyang-si (KR); Hyun Jae Na, Seoul (KR); Dong Hwan Shim, Yongin (KR); Byung Du Ahn, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 53 days.

(21) Appl. No.: 14/715,490

(22) Filed: May 18, 2015

(65) Prior Publication Data

US 2015/0348494 A1 Dec. 3, 2015

(30) Foreign Application Priority Data

May 30, 2014 (KR) .......................... 10-2014-0065985

(51) Int. Cl.
*G09G 3/36* (2006.01)
*H01L 31/0224* (2006.01)

(52) U.S. Cl.
CPC ...... *G09G 3/3648* (2013.01); *G09G 2330/021* (2013.01); *G09G 2360/144* (2013.01); *H01L 31/022466* (2013.01)

(58) Field of Classification Search
CPC .............................. G09G 3/36–3/3696; G09G 2300/0421–2300/0465; G09G 2330/02–2330/024; G09G 2320/0204; G09G 2320/0219; G09G 2320/0233; G09G 2320/0626; G09G 2320/066; G09G 2320/0666; G09G 2360/14–2360/148; H01L 31/0224; H01L 31/022466–31/022491; H01L 31/04; H01L 31/042; H01L 31/0445–31/0475

See application file for complete search history.

(56) References Cited

U.S. PATENT DOCUMENTS

D637,952 S 5/2011 Tan
7,948,471 B2 * 5/2011 Choo ................... G09G 3/3659
345/104

(Continued)

FOREIGN PATENT DOCUMENTS

| JP | 2011-14513 A | 1/2011 |
|---|---|---|
| KR | 10-2004-0051484 A | 6/2004 |
| KR | 10-2013-0037072 A | 4/2013 |

OTHER PUBLICATIONS

Stirn, R.J. et al., A 15% efficient antireflection-coated metal-oxide-semiconductor solar cell, Applied Physics Letters, 1975, pp. 95-98, vol. 27, No. 2, American Institute of Physics.

(Continued)

*Primary Examiner* — Nathan Danielsen
(74) *Attorney, Agent, or Firm* — Lewis Roca Rothgerber Christie LLP

(57) ABSTRACT

A display device includes a first pixel coupled to a first scan line and a first data line. The first pixel includes a switching transistor including a control terminal connected to the first scan line and an input terminal connected to the first data line, and is turned on by an on-scan signal, a first transistor including a first control terminal connected to the first scan line, a first input terminal connected to the first data line, and a first output terminal connected to the first control terminal; and a second transistor including a second control terminal connected to the first output terminal, a second input terminal receiving a base voltage, and a second output terminal connected to the second control terminal. The first and second transistors respectively convert light into first and (Continued)

second currents outputted respectively to the first and second output terminals in response to an off-scan signal.

20 Claims, 9 Drawing Sheets

(56) References Cited

U.S. PATENT DOCUMENTS

| | | | |
|---|---|---|---|
| 8,368,654 B2 | 2/2013 | Rosenblatt et al. | |
| D689,016 S | 9/2013 | Nook et al. | |
| 8,522,492 B2 | 9/2013 | Tachino | |
| 8,609,981 B2 | 12/2013 | Chen et al. | |
| 2004/0201786 A1* | 10/2004 | Park | G02F 1/13318 349/12 |
| 2009/0051645 A1* | 2/2009 | Chen | G09G 3/3648 345/104 |
| 2012/0080084 A1 | 4/2012 | Suh et al. | |
| 2012/0127140 A1* | 5/2012 | Ryan | G09G 3/3648 345/207 |
| 2013/0057410 A1 | 3/2013 | Gallert | |
| 2013/0292668 A1 | 11/2013 | Oh et al. | |
| 2014/0152632 A1* | 6/2014 | Shedletsky | G09G 5/10 345/207 |

OTHER PUBLICATIONS

He, J. et al., Dye-Sensitized Nanostructured p-Type Nickel Oxide Film as a Photocathode for a Solar Cell, Journal of Physical Chemistry B., 1999, pp. 8940-8943, vol. 103, No. 42, American Chemical Society.

Hara, K. et al., Highly efficient photon-to-electron conversion with mercurochrome-sensitized nanoporous oxide semiconductor solar cells, Solar Energy Materials & Solar Cells, 2000, pp. 115-134, vol. 64, Elsevier Science B.V.

Gupta, A. et al., All-sputtered 14% CdS/CdTe thin-film solar cell with ZnO:Al transparent conducting oxide, Applied Physics Letters, 2004, pp. 684-686, vol. 85, No. 4, American Institute of Physics.

Wang, K. et al., Direct Growth of Highly Mismatched Type II ZnO/ZnSe Core/Shell Nanowire Arrays on Transparent Conducting Oxide Substrates for Solar Cell Applications, Advanced Materials, 2008, pp. 3248-3253, vol. 20, Wiley-VCM Verlag GmbH & Co. KGaA, Weinheim.

Abstract for U.S. Patent Publication No. 2013/0292668 A1, Nov. 7, 2013.

* cited by examiner

DISPLAY DEVICE AND METHOD OF DRIVING THE SAME

CROSS-REFERENCE TO RELATED APPLICATION

This application claims priority to and the benefit of Korean Patent Application No. 10-2014-0065985 filed on May 30, 2014 in the Korean Intellectual Property Office, the disclosure of which is incorporated herein by reference in its entirety.

BACKGROUND

1. Field

The invention relates to a display device.

2. Description of the Related Art

Display devices, which have been employed in a variety of fields, often need a considerable amount of driving power to be driven, and solar cells have been used for assisting in supplying driving power to display devices. Solar cells can convert external light such as sunlight or backlight into a current and can thus provide a uniform voltage to display devices, even though not typically as a primary power source. Solar cells can be used in display devices in the form of P-N junction diodes or dye-sensitized solar cell panels.

However, P-N junction diodes exhibit low optical transmissivity and thus can generally be used only in the non-display areas of a display device. Dye-sensitized solar cell panels can be formed of a transparent material, but may suffer from low optical conversion efficiency.

SUMMARY

Exemplary embodiments of the present invention provide a display device including solar cells, which are formed of a transparent material and can provide high optical conversion efficiency.

However, exemplary embodiments of the present invention are not restricted to those set forth herein. The above and other exemplary embodiments of the present invention will become more apparent to one of ordinary skill in the art to which the present invention pertains by referencing the detailed description of embodiments according to the present invention given below.

According to an exemplary embodiment of the present invention, there is provided a display device including a first pixel at a region defined by a first scan line and a first data line, wherein the first pixel includes a switching transistor which includes a control terminal connected to the first scan line and an input terminal connected to the first data line, and configured to be turned on by an on voltage of a scan signal from the first scan line, a first transistor including a first control terminal connected to the first scan line, a first input terminal connected to the first data line and a first output terminal connected to the first control terminal, and a second transistor including a second control terminal connected to the first output terminal, a second input terminal configured to receive a base voltage and a second output terminal connected to the second control terminal, wherein the first transistor is configured to convert light into a first current to be outputted to the first output terminal, in response to an off voltage of the scan signal, and wherein the second transistor is configured to convert light into a second current to be outputted to the second output terminal, in response to an off voltage of the scan signal.

The first pixel may further include a third transistor including a third control terminal connected to the second output terminal of the second transistor, a third input terminal configured to receive a base voltage, and a third output terminal connected to the third control terminal.

The first transistor, the second transistor and the third transistor may be oxide thin film transistors.

The display device may further include a second pixel arranged side by side with the first pixel along an extending direction of the first scan line or an extending direction of the first data line, wherein the second pixel further includes a third transistor including a third control terminal connected to the second output terminal of the second transistor, a third input terminal configured to receive a base voltage, and a third output terminal connected to the third control terminal.

The display device may further include a second pixel which is not aligned with the first pixel along an extending direction of the first scan line or an extending direction of the first data line.

The second pixel may further include a third transistor including a third control terminal connected to the second output terminal of the second transistor, a third input terminal configured to receive a base voltage, and a third output terminal connected to the third control terminal.

The first current may be combined with the second current at the second output terminal.

The display device may further include a voltage generator configured to generate and output a driving voltage for the first pixel, wherein the voltage generator is configured to receive the first current and the second current combined at the second output terminal.

The display device may further include a third transistor including a third control terminal connected to the second output terminal of the second transistor, a third input terminal configured to receive a base voltage, and a third output terminal connected to the third control terminal, wherein the third transistor is configured to convert light into a third current in response to an off voltage of the scan signal, wherein the third current is outputted to the third output terminal, and wherein the first current and the second current combined at the second output terminal are combined with the third current at the third output terminal.

The display device may further include a voltage generator configured to generate and output a driving voltage for the first pixel, wherein the voltage generator is configured to receive the first current, the second current and the third current combined at the third output terminal.

The first transistor and the second transistor may form one solar cell unit.

According to an exemplary embodiment of the present invention, there is provided a display device comprising a first pixel at a region defined by a first scan line and a first data line, and a second pixel arranged side by side with the first pixel, wherein the first pixel includes a switching transistor which includes a control terminal connected to the first scan line and an input terminal connected to the first data line, and is configured to be turned on by an on voltage of a scan signal from the first scan line, and a first transistor including a first control terminal connected to the first scan line, a first input terminal connected to the first data line and a first output terminal connected to the first control terminal, wherein the second pixel includes a second transistor including a second control terminal connected to the first output terminal, a second input terminal configured to receive a base voltage, and a second output terminal connected to the second control terminal, wherein the first transistor is configured to convert light into a first current to be outputted to the first output terminal, in response to an off voltage of the scan signal, and wherein the second transistor is configured to convert light into a second current to be outputted to the second output terminal, in response to an off voltage of the scan signal.

The first pixel and the second pixel may be arranged along the first scan line.

The first pixel and the second pixel may be arranged along the first data line.

The first pixel and the second pixel may not be arranged along any of the first scan line and the first data line.

The display device may further include a third pixel different from the first pixel and the second pixel, wherein the first pixel, the second pixel or the third pixel may include a third transistor including a third control terminal connected to the second output terminal of the second transistor, a third input terminal configured to receive a base voltage, and a third output terminal connected to the third control terminal, wherein the third transistor is configured to convert light into a third current to be outputted to the third output terminal, in response to an off voltage of the scan signal.

The display device may further include a voltage generator configured to generate and output a driving voltage for the first pixel, wherein the first current may be combined with the second current at the second output terminal, and the voltage generator is configured to receive the first current and the second current combined at the second output terminal.

According to an exemplary embodiment of the present invention, there is provided a display device including a first substrate including a plurality of pixels including a plurality of driving transistors, and a second substrate facing the first substrate and arranged above the first substrate, wherein the second substrate includes at least one solar cell unit, wherein the solar cell unit includes a first transistor including a first control terminal, a first input terminal configured to receive a base voltage, and a first output terminal connected to the first control terminal, and a second transistor including a second control terminal connected to the first output terminal, a second input terminal configured to receive a base voltage, and a second output terminal connected to the second control terminal, and wherein the first transistor and the second transistor may be oxide semiconductors.

The second substrate may include a color filter layer and an encapsulation layer, and the solar cell units may be between the color filter layer and the encapsulation layer.

The second substrate may include a color filter layer and an encapsulation layer, and the solar cell units may be above the encapsulation layer.

The solar cell units may overlap the pixels, respectively.

According to the exemplary embodiments, it is possible to provide high optical transmissivity by forming each solar cell with one or more transistors with an oxide semiconductor layer.

In addition, it is possible to easily provide a large amount of current in proportion to the number of transistors.

Other features and exemplary embodiments will be apparent from the following detailed description, the drawings, and the claims.

DETAILED DESCRIPTION

Figure 1:
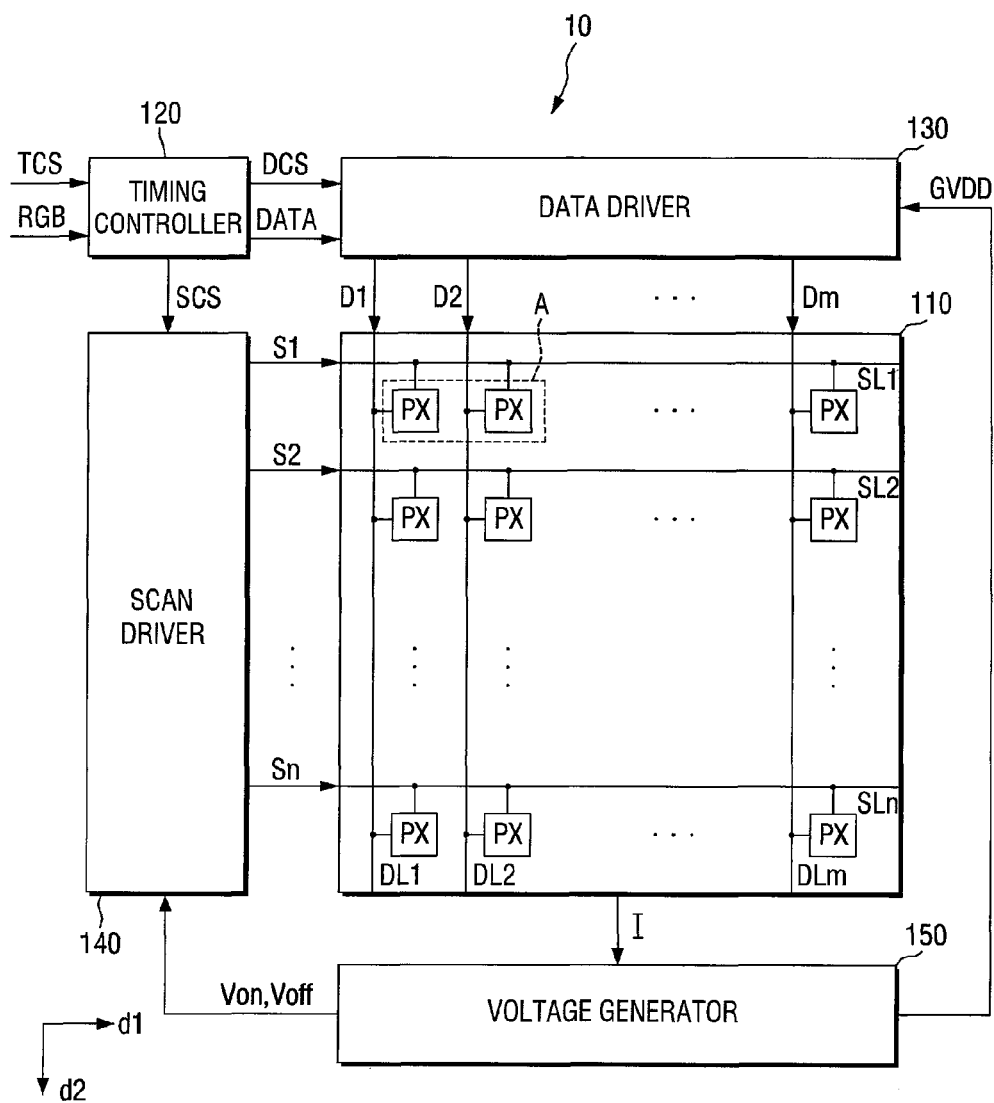
FIG. 1 is a block diagram of a display device according to an exemplary embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse suitable forms. The matters defined in the description, such as the detailed construction and elements, are nothing but specific details provided to assist those of ordinary skill in the art in a comprehensive understanding of the invention, and the present invention is defined by the scope of the appended claims and their equivalents.

The term "on" that is used to designate that an element is on another element or located on a different layer or a layer includes both a case where an element is located directly on another element or a layer and a case where an element is located on another element via another layer or still another element. In the entire description of embodiments according to the present invention, the same drawing reference numerals are used for the same elements across various figures.

Although the terms "first, second, and so forth" are used to describe diverse constituent elements, such constituent elements are not limited by the terms. The terms are used to discriminate a constituent element from other constituent elements. Accordingly, in the following description, a first constituent element may alternatively be referred to as a second constituent element, and vice versa.

Exemplary embodiments of the present invention will hereinafter be described with reference to the accompanying drawings.

FIG. 1 is a block diagram of a display device according to an exemplary embodiment of the present invention.

Referring to FIG. 1, a display device 10 includes a display panel 110, a timing controller 120, a data driver 130, a scan driver 140 and a voltage generator 150.

The display panel 110 displays an image. The display panel 110 may be a liquid crystal display (LCD) panel, an electrophoretic display panel, an organic light-emitting diode (OLED) display panel, a light-emitting diode (LED) panel, an inorganic electro-luminescent (EL) display panel, a field emission display (FED) panel, a surface-conduction electron-emitter (SED) display panel, a plasma display panel (PDP), a cathode ray tube (CRT) display panel, or any other suitable display panel. In the description that follows, it is assumed that the display device 10 and the display panel 110 are an LCD device and an LCD panel, respectively, but the present invention is not limited thereto. That is, the present invention can be applied to various suitable types of display devices and display panels, other than an LCD device and an LCD panel.

The display panel 110 may include a plurality of scan lines SL1, SL2, . . . , SLn, a plurality of data lines DL1, DL2, . . . , DLm crossing the scan lines SL1, SL2, . . . , SLn, and a plurality of pixels PX connected to the scan lines SL1, SL2, SLn and to the data lines DL1, DL2, . . . , DLm. The scan lines SL1, SL2, . . . , SLn may extend in a first direction d1, and may be substantially in parallel with one another. The scan lines SL1, SL2, . . . , and SLn may include first through n-th scan lines SL1 through SLn that are sequentially aligned. The data lines DL1, DL2, . . . , DLm may cross the scan lines SL1, SL2, . . . , SLn. That is, the data lines DL1, DL2, . . . , DLm may extend in a second direction d2, which is perpendicular to the first direction d1, and may be substantially in parallel with one another. The first direction d1 may correspond to a row direction, and the second direction d2 may correspond to a column direction. A plurality of data voltages D1, D2, . . . , Dm may be applied to the data lines DLA, DL2, . . . , DLm, respectively. The pixels PX may be arranged in a matrix, but the present invention is not limited thereto. Each of the pixels PX may be connected to one of the scan lines SL1, SL2, . . . , SLn and one of the data lines DL1, DL2, . . . , DLm. Each of the pixels PX may receive one of a plurality of scan signals S1, S2, . . . , Sn from one of the scan lines SL1, SL2, . . . , SLn connected thereto and may receive one of the data voltages D1, D2, . . . , Dm from one of the data lines DL1, DL2, . . . , DLm connected thereto in response to the receipt of one of the scan signals S1, S2, . . . , Sn.

The timing controller 120 may receive a timing control signal TCS from an external system and may generate a scan control signal SCS for controlling the scan driver 140 and a data control signal DCS for controlling the data driver 130. The timing control signal TCS may be a vertical synchronization signal Vsync, a horizontal synchronization signal Hsync, a data enable signal DE and/or a clock signal CLK. The timing controller 120 may receive an image signal RGB from the external system. The timing controller 120 may provide image data DATA, which is obtained by converting or correcting the image signal RGB, to the data driver 130.

The data driver 130 may include a shift register, a latch and a digital-to-analog converter (DAC). The data driver 130 may receive the data control signal DCS and the image data DATA from the timing controller 120. The data driver 130 may select a gamma reference voltage GVDD according to the data control signal DCS, and may convert the image data DATA, which has a digital waveform, into the data voltages D1, D2, . . . , Dm based on the gamma reference voltage GVDD. The data driver 130 may output the data voltages D1, D2, . . . , Dm to the display panel 110.

The scan driver 140 may receive the scan control signal SCS from the timing controller 120. The scan driver 140 may output the scan signals S1, S2, . . . , Sn to the display panel 110 according to the scan control signal SCS.

The voltage generator 150 may generate various driving voltages based on external power provided by an external power source, and may output the generated driving voltages. That is, the voltage generator 150 may provide a gate-on voltage Von for turning on thin-film transistors (TFTs) and a gate-off voltage Voff for turning off the TFTs and may provide the gate-on voltage Von and the gate-of voltage Voff. Also, the voltage generator 150 may generate the gamma reference voltage GVDD and may provide the gamma reference voltage GVDD to the data driver 130.

Each of the pixels PX may include at least one of a first transistor T1 and a second transistor T2 which convert external light into a current. The external light may be light provided by an external light source outside the display device 10 or backlight provided by a backlight unit of the display device 10. The first transistor T1 and the second transistor T2 may form together a single solar cell unit A, which generates an optical current, amplifies the optical current and provides the amplified optical current to the voltage generator 150. That is, the solar cell unit A may serve as an auxiliary power source, and may thus increase the operating time of the display device 10. The solar cell unit A will hereinafter be described with reference to FIGS. 2 to 5.

Figure 2:
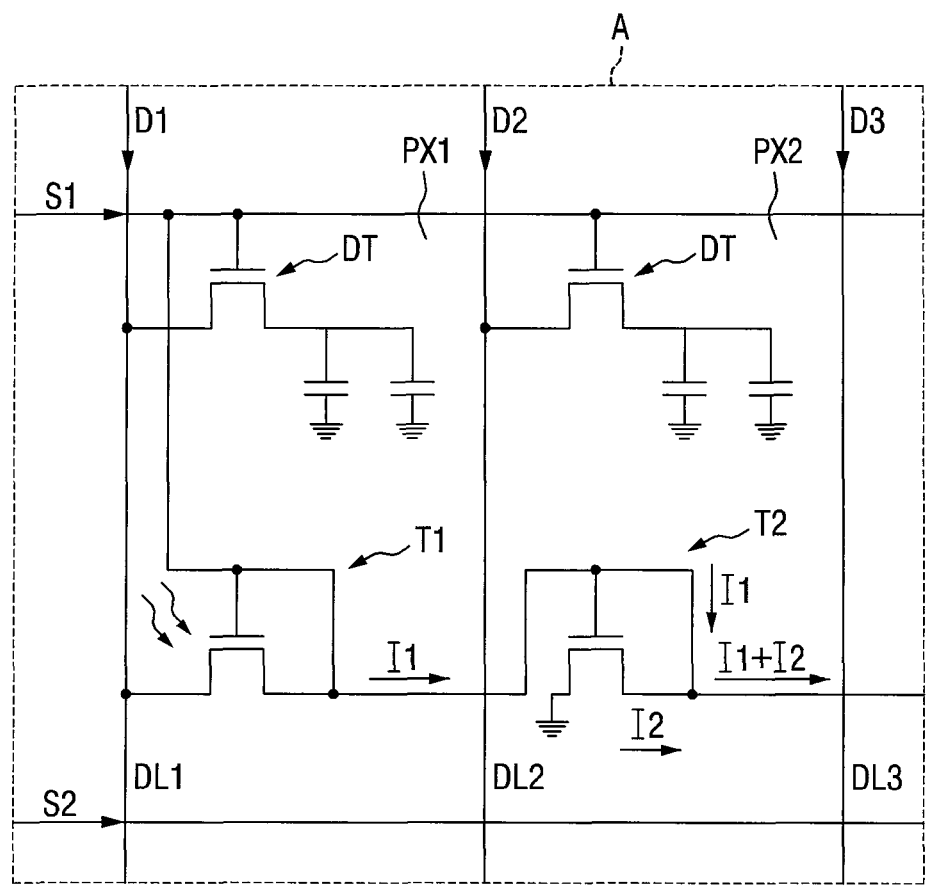
FIG. 2 is a circuit diagram of a solar cell unit according to an exemplary embodiment of the present invention.
Figure 3:
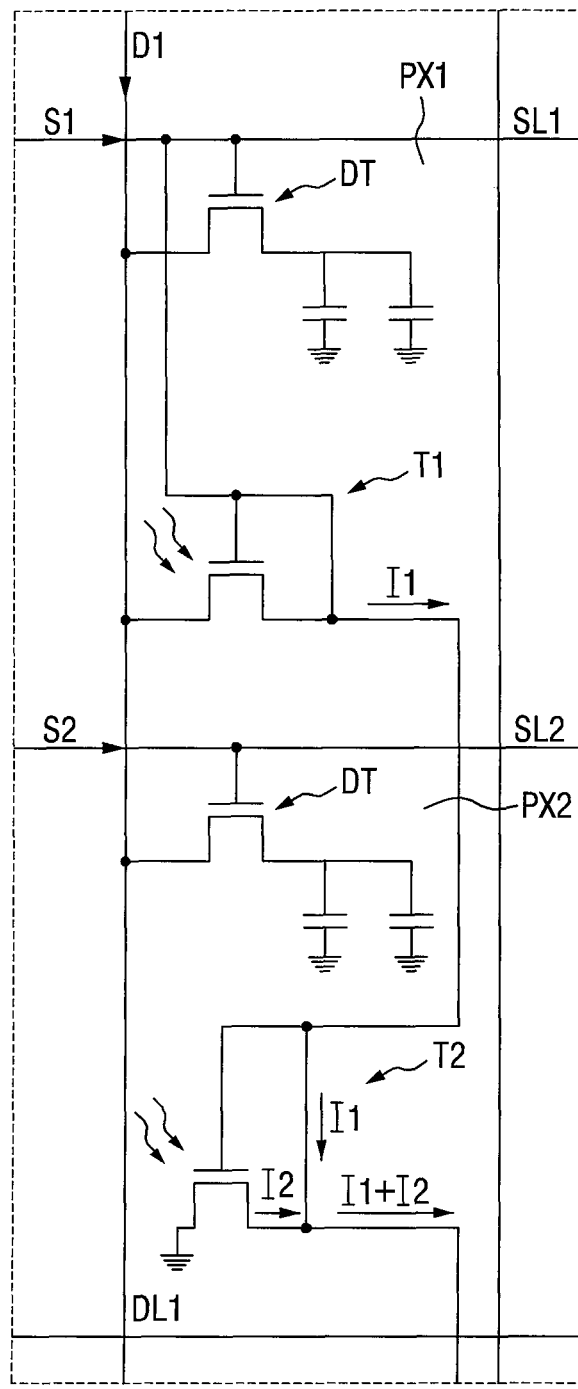
FIGS. 3 to 5 are circuit diagrams of solar cell units according to other exemplary embodiment of the present invention.
Figure 4:
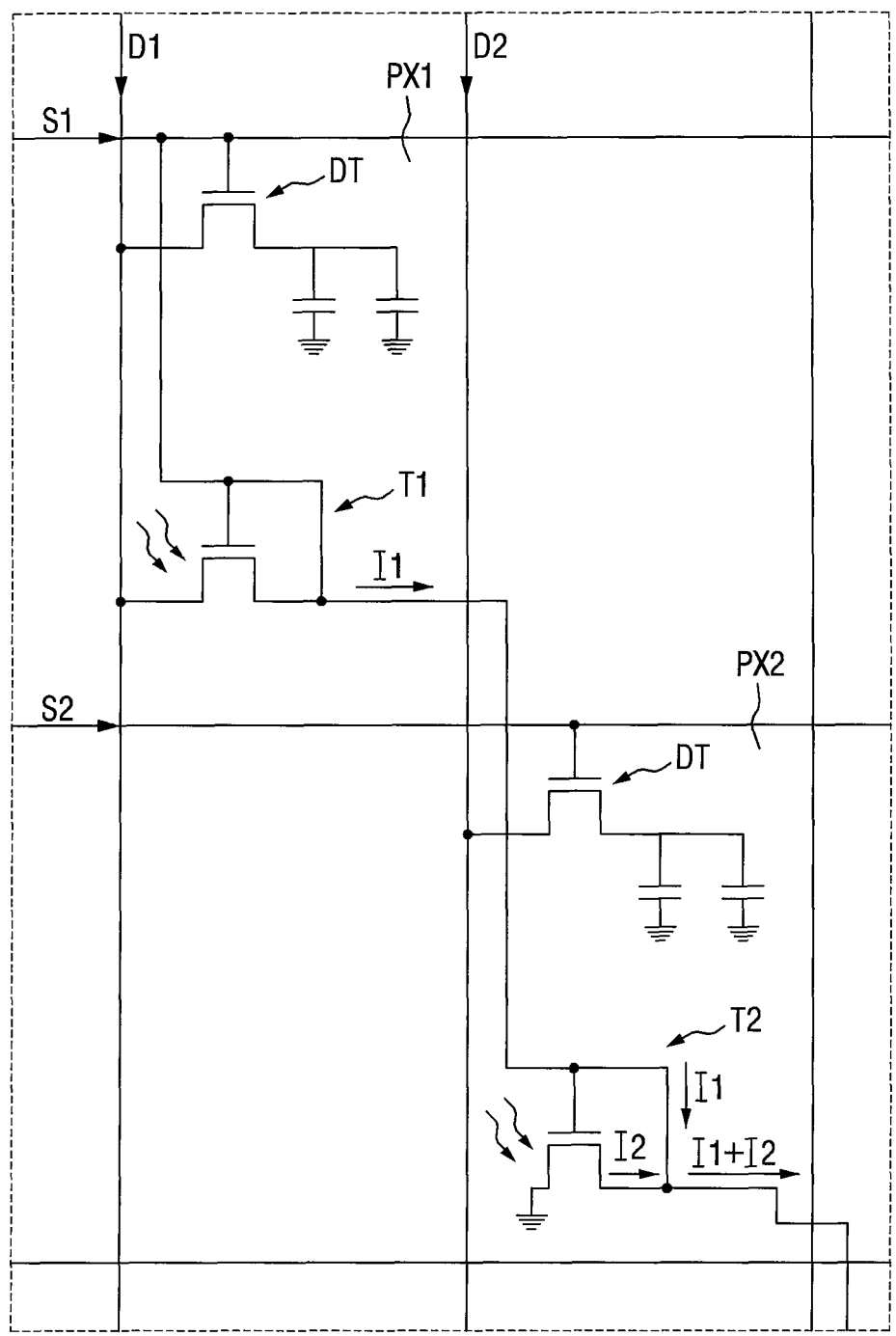
Figure 5:
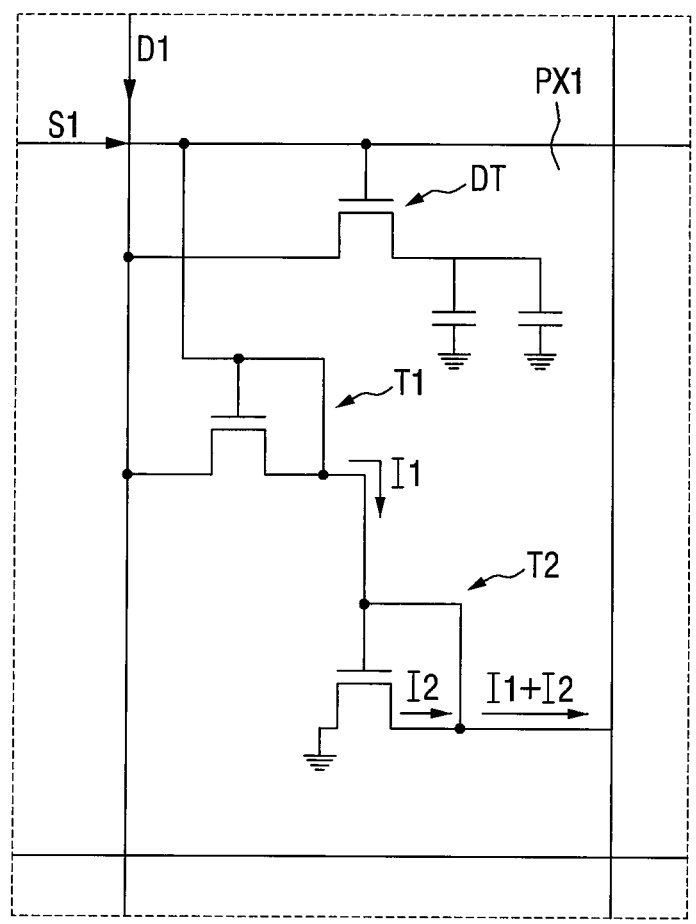

FIG. 2 is a circuit diagram of a solar cell unit according to an exemplary embodiment of the present invention. For example, FIG. 2 may be an enlarged plan view of portion A of FIG. 1. FIGS. 3 to 5 are circuit diagrams of solar cell units according to other exemplary embodiments of the present invention.

Referring to FIG. 2, a first pixel PX1 may include a first transistor T1, and a second pixel PX2 may include a second transistor T2. The first pixel PX1 may be one of the pixels PX of the display panel 110, and is not limited to any particular pixel. The second pixel PX2 may be a pixel neighboring the first pixel PX1. The second pixel PX2 may neighbor the first pixel PX1 in a row direction, as illustrated in FIG. 2. For example, the first pixel PX1 and the second pixel PX2 may be arranged side-by-side along the first scan line SU, but the present invention is not limited thereto.

Referring to FIG. 3, the first transistor T1 and the second transistor T2 may be formed in the first pixel PX1 and the second pixel PX2, respectively, and the first pixel PX1 and the second pixel PX2 may neighbor each other in a column direction. For example, the first pixel PX1 and the second pixel PX2 may be arranged side-by-side along the first data line DL1, but the present invention is not limited thereto.

Referring to FIG. 4, the first transistor T1 and the second transistor T2 may be formed in the first pixel PX1 and the second pixel PX2, respectively, and the first pixel PX1 and the second pixel PX2 may neighbor each other in a diagonal direction. That is, the first pixel PX1 and the second pixel PX2 may not be aligned side-by-side along, for example, the first data line DL1 or the first scan line SL1.

Referring to FIG. 5, the first transistor T1 and the second transistor T2 may be formed in the same pixel. That is, the first pixel PX1 may include both the first transistor T1 and the second transistor T2.

The first transistor T1 and the second transistor T2 may be oxide TFTs. That is, semiconductor layers of the first transistor T1 and the second transistor T2 may be formed of an oxide semiconductor. The term "oxide semiconductor", as used herein, may indicate a compound including oxygen and one or more elements such as indium (In), gallium (Ga), zinc (Zn), or tin (Sn). The oxide semiconductor may be an amorphous oxide semiconductor or a crystalline oxide semiconductor. The amorphous oxide semiconductor may be indium gallium zinc oxide (IGZO), and the crystalline oxide semiconductor may be one of zinc oxide (ZnO), indium zinc oxide (IZO), indium gallium oxide (IGO), indium tin oxide (ITO) and indium oxide (InO). Oxide TFTs can be highly transparent and can thus transmit visible light therethrough. Because not only the semiconductor layers, but also the rest of the first transistor T1 and the second transistor T2, may be formed of a transparent material, a decrease in aperture ratio can be reduced or minimized even though the first transistor T1 and the second transistor T2 are formed in the same pixel PX or in different pixels PX. Also, because the pixels PX are provided in an area where external light and backlight can be easily received, the introduction of external light into the semiconductor layers of the first transistor T1 and the second transistor T2 can be facilitated.

The first transistor T1 may include a first control terminal connected to the first scan line SL1, a first input terminal connected to the first data line DL1, and a first output terminal connected to the first control terminal. The first transistor T1 may be connected to the same scan line and the same data line as a driving transistor DT formed in the first pixel PX1, and may be formed together with the driving transistor DT. That is, each solar cell unit A may be formed together with each driving transistor DT during the fabrication of the display panel 110.

A driving transistor DT may be a switching transistor, which is turned on by a positive voltage, i.e., the gate-on voltage Von, and turned off by a negative voltage, i.e., the gate-off voltage Voff. The first transistor T1, unlike a driving transistor DT, has the first control terminal and the first output terminal connected to each other, and thus, the first input terminal and the first output terminal may be electrically connected to each other regardless of a signal applied to the first control terminal. The first transistor T1 may be a photo-transistor, and as a result, the amount of current generated by the first transistor T1 may vary depending on whether or not there is light applied to the semiconductor layer of the first transistor T1. That is, the first transistor T1 may generate more current when there is light applied to the semiconductor layer thereof than when there is no light applied to the semiconductor layer thereof. The more a gate-drain voltage Vgd, which is the difference between the first control terminal voltage and the first input terminal voltage of the first transistor T1, decreases below 0V, the greater the ratio of a current ID generated without external light present and a current IL generated with external light present becomes. The properties of the first transistor T1 will hereinafter be described in further detail with reference to FIGS. 6 and 7.

Figure 6:
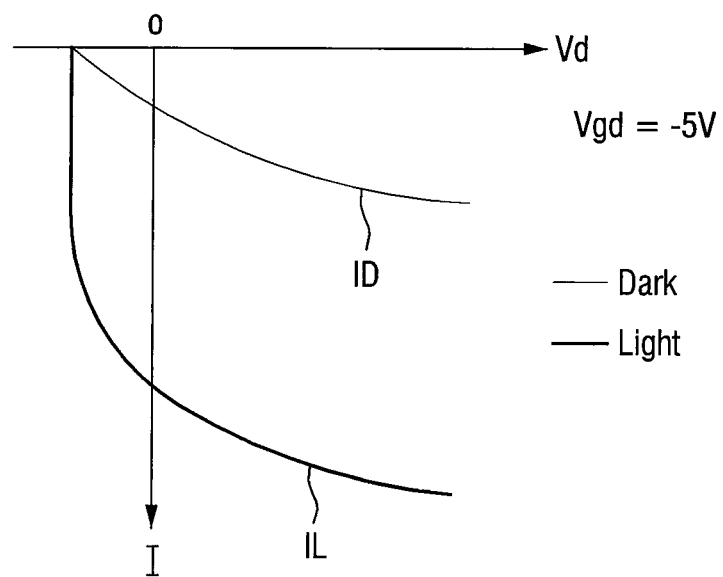
FIGS. 6 and 7 are graphs illustrating the properties of a first transistor according to an exemplary embodiment of the present invention.
Figure 7:
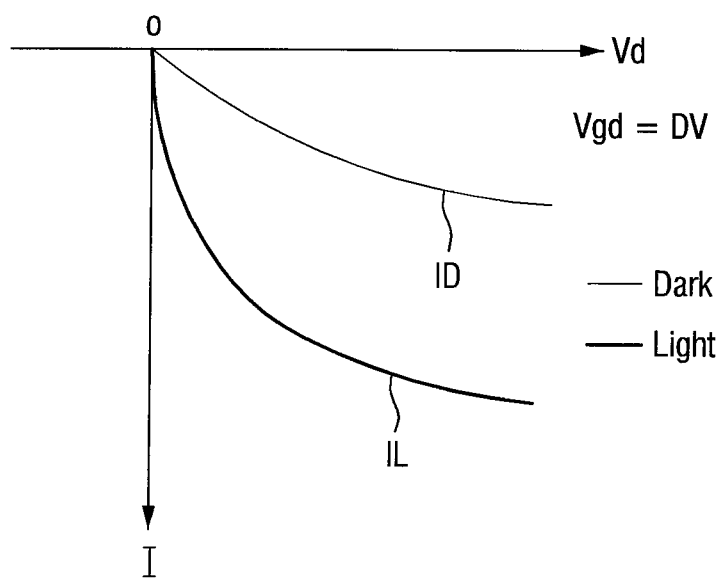

FIGS. 6 and 7 are graphs illustrating the properties of a first transistor according to an exemplary embodiment of the present invention.

For example, FIG. 6 shows the amount of current generated with or without external light present when the gate-drain voltage Vgd is 0V, and FIG. 7 shows the amount of current generated with or without external light present when the gate-drain voltage Vgd is −5V. Referring to FIGS. 6 and 7, the X axis represents a first input terminal voltage Vd of the first transistor T1, and the Y axis represents a current I generated in the channel of the first transistor T1.

The amount of current IL generated with external light present may be greater when the gate-drain voltage Vgd is −5V than when the gate-drain voltage Vgd is 0V. That is, the more the gate-drain voltage Vgd decreases below 0V, the more activated the first transistor T1 becomes, and the more current is generated. The scan signal S1 may be applied to the first control terminal of the first transistor T1, and the data voltage D1 may be applied to the first input terminal of the first transistor T1. That is, the amount of the current I generated in the channel of the first transistor T1 may vary depending on the levels of the scan signal S1 and the data voltage D1. The scan signal S1 may include the gate-on voltage Von, which is a positive voltage, and the gate-off voltage Voff, which is a negative voltage. The data voltage D1, which is an analog voltage (e.g., an analog voltage having a predetermined level), may have a positive or negative polarity. In response to the gate-off voltage Voff being applied to the first control terminal of the first transistor T1 and the data voltage D1, which is applied to the first input terminal of the first transistor T1, having a positive polarity, a considerable amount of current may be generated. That is, the first transistor T1 may generate a considerable amount of current, i.e., a first current I1, by using a scan signal and a data voltage, which are used for driving a driving transistor DT.

The first transistor T1 may provide the first current I1 to the second transistor T2. The second transistor T2 may have a second control terminal connected to the source terminal of the first transistor T1, a second input terminal connected to ground wiring, and a second output terminal connected to the second control terminal thereof. Because the gate terminal of the second transistor T2 may be provided with the gate-off voltage Voff, which is a negative voltage and the second input terminal of the second transistor T2 may be provided through the ground wiring with the ground voltage, which corresponds to 0V, a gate-drain voltage Vgd of the second transistor T2 may easily become lower than 0V. That is, the second transistor T2 may stably generate a second current I2, which corresponds to the first current I1 generated by the first transistor T1. Not only the first current I1, which is provided by the first transistor T1, but also the second current I2, which is generated in the channel of the second transistor T2, may be applied to the second output terminal of the second transistor T2. The second output terminal of the second transistor T2 may be connected to the voltage generator 150, and may provide the first current I1 and the second current I2 to the voltage generator 150. The voltage generator 150 may include a configuration that stores electric current supplied from the solar cell unit A and a configuration that prevents or substantially prevents the stored current from being discharged to the solar cell unit A.

A plurality of solar cell units A, each including a first transistor T1 and a second transistor T2, may be defined on the display panel 110 where the pixels PX are provided. The solar cell units A may generate currents and the generated currents may be combined and provided to the voltage generator 150.

Because the first transistor T1 and the second transistor T2 of each of the solar cell units A are formed as oxide TFTs, high transparency can be guaranteed and a large amount of current can be generated easily.

A solar cell unit according to another exemplary embodiment of the present invention will hereinafter be described.

Figure 8:
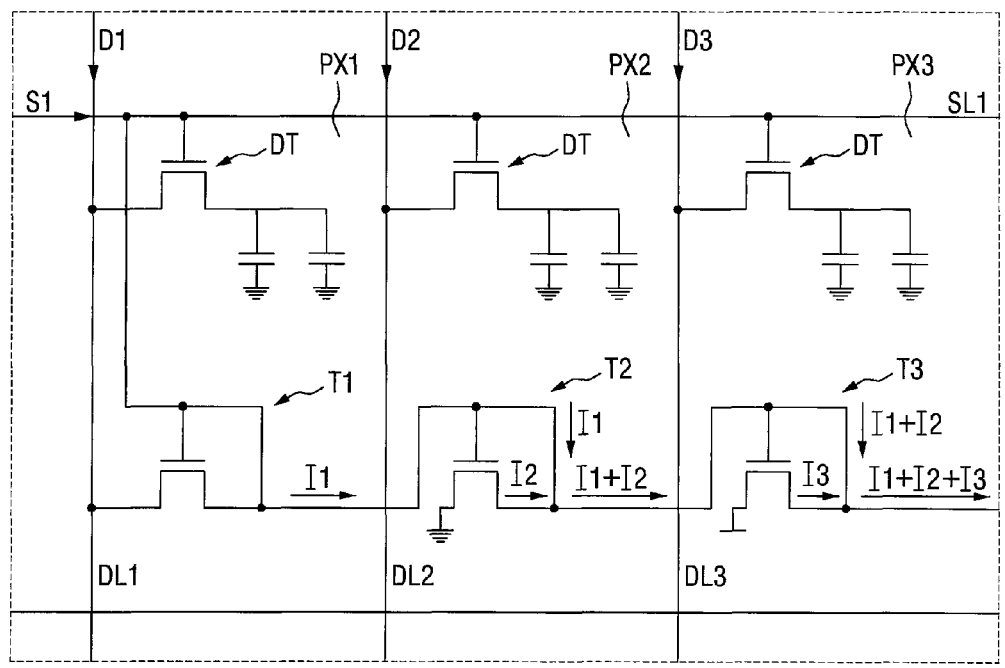
FIG. 8 is a circuit diagram of a solar cell unit according to another exemplary embodiment of the present invention.

FIG. 8 is a circuit diagram of a solar cell unit according to another exemplary embodiment of the present invention. Referring to FIG. 8, a solar cell unit may further include a third transistor T3 cascaded with the second transistor T2.

The third transistor T3 may have a third control terminal connected to the second output terminal of the second transistor T2, a second input terminal connected to ground wiring, and a third output terminal connected to the third control terminal. The third transistor T3 may be formed as an oxide TFT, and may have the same or substantially the same structure as the second transistor T2. Thus, the third transistor T3 may generate a third current I3 in the same or substantially the same manner as the second transistor T2. The third current I3 outputted to the third output terminal may be combined at the third output terminal with first and second currents (I1+I2) provided from the second output terminal I2 of the second transistor T2. The second transistor T2 and the third transistor T3 may be cascaded, and may be amplifier transistors for amplifying a first current I1 output by the first transistor T1. The third transistor T3 may output a combined current obtained by combining the first current I1, a second current I2, and the third current I3.

As illustrated in FIG. 8, the first transistor T1, the second transistor T2, and the third transistor T3 may be formed in separate pixels, i.e., a first pixel PX1, a second pixel PX2, and a third pixel PX3, respectively. The third pixel PX3 may neighbor the second pixel PX2 in a row direction or a column direction, but the present invention is not limited thereto. Alternatively, the third transistor T3 may be formed in the first pixel PX1 or the second pixel PX2 where the first transistor T1 or the second transistor T2 is formed.

A plurality of cascaded third transistors T3 may be provided, in which case, a total amount of current provided to the voltage generator 150 may be increased in proportion to the number of cascaded third transistors T3. Accordingly, it is possible to further improve optical conversion efficiency and provide a considerable amount of current to the voltage generator 150.

The descriptions of the parts of the display device 10 of the exemplary embodiment of FIGS. 1 to 7 are directly or substantially applicable to the exemplary embodiment of FIG. 8, and thus, will not be repeated.

A display device according to another exemplary embodiment of the invention will hereinafter be described.

Figure 9:
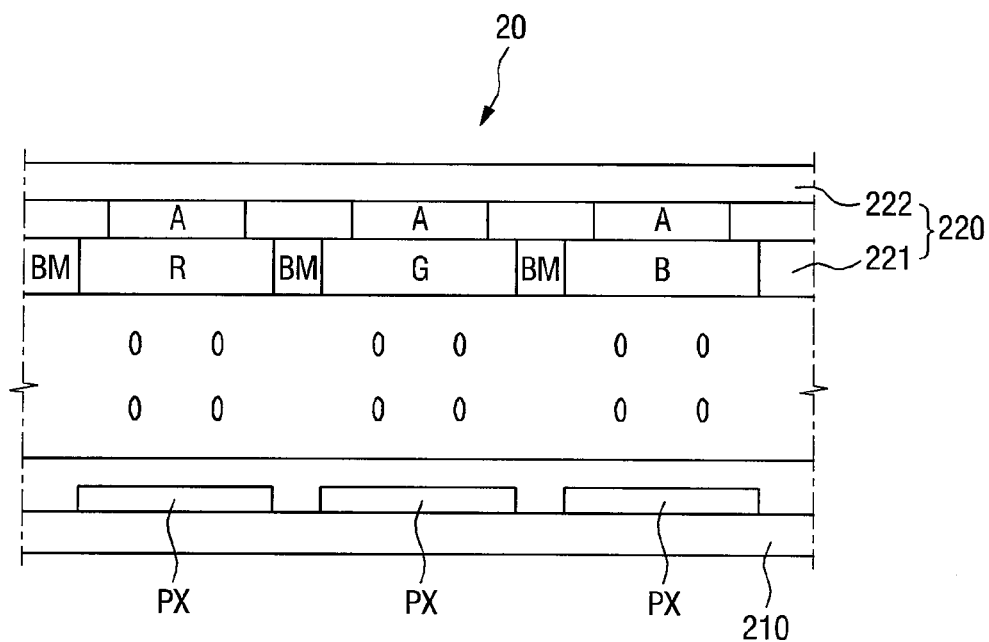
FIG. 9 is a cross-sectional view of a display device according to another exemplary embodiment of the present invention.
Figure 10:
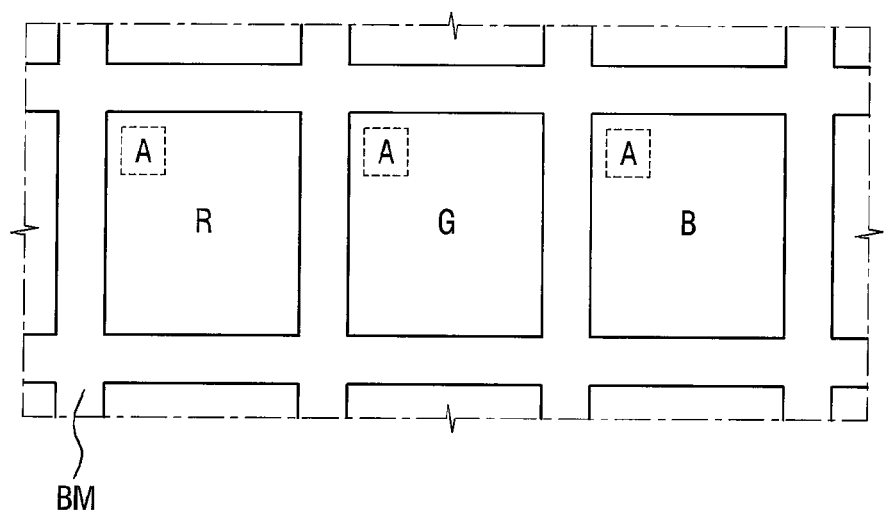
FIG. 10 is a plan view of the display device illustrated in FIG. 9.
Figure 11:
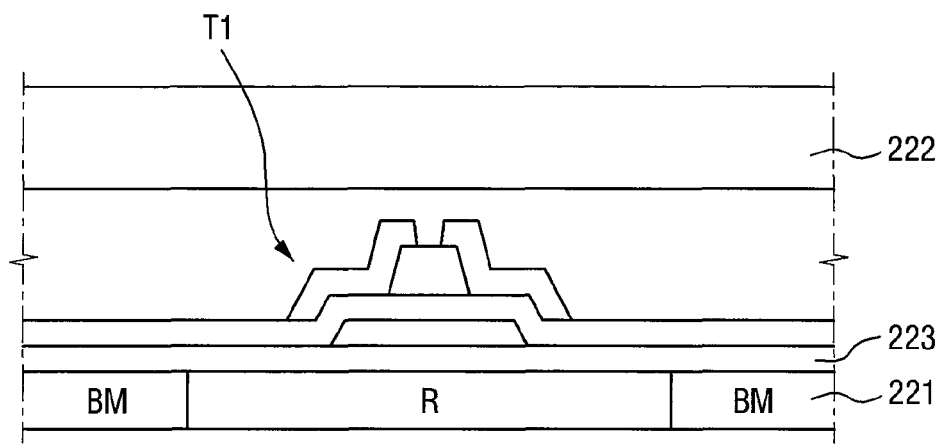
FIGS. 11 and 12 are plan views of solar cell units according to other exemplary embodiments of the present invention.
Figure 12:
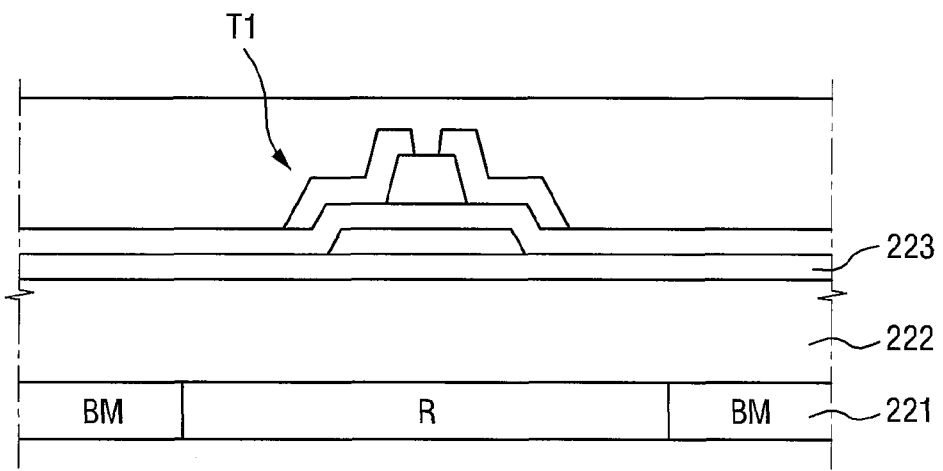

FIG. 9 is a cross-sectional view of a display device according to another exemplary embodiment of the invention, FIG. 10 is a plan view of the display device illustrated in FIG. 9, and FIGS. 11 and 12 are plan views of solar cell units according to other exemplary embodiments of the invention.

Referring to FIGS. 9 to 12, a display device 20 includes a first substrate 210 and a second substrate 220.

The first substrate 210 may include a plurality of pixels PX in which a plurality of driving transistors are provided. That is, the first substrate 210 may be an array substrate. The luminance of the pixels PX may be controlled by the driving transistors, and the pixels PX may display an image. The second substrate 220 may face the first substrate 210. A liquid crystal layer may be interposed between the first substrate 210 and the second substrate 220. The display device 20 may be an LCD device, but the present invention is not limited thereto. That is, the display device 20 may be an OLED display device, in which a plurality of OLEDs that can emit light are provided in the pixels PX, respectively, and no liquid crystal layer is provided.

The second substrate 220 may be an encapsulation substrate, and may protect the pixels PX on the first substrate 210. That is the second substrate 220 may be bonded to the first substrate 210 and may thus prevent or reduce infiltration of external air or foreign material.

The second substrate 220 may include a plurality of solar cell units A. Each of the solar cell units A may include a first transistor T1 for converting external light into a current and a second transistor T2 cascaded with the first transistor T1. The first transistor and the second transistor of the solar cell units A may convert external light from an external source or backlight from a backlight unit into a current, may easily combine the currents, and may provide the combined current to a voltage generator. That is, the solar cell units A may serve as auxiliary power sources assisting the external power source. Because the solar cell units A are not provided in the pixels PX, respectively, voltage wiring, which provides a negative voltage (e.g., a predetermined negative voltage), may be connected to the gate terminal of the first transistor T1 of each of the solar cell units A, and ground wiring may be connected to the drain terminal of the first transistor T1 of each of the solar cell units A. The solar cell units A are substantially identical to the solar cell units A of the exemplary embodiment of FIGS. 1 to 7, and thus, a detailed description thereof will be omitted.

The first transistor T1 and the second transistor T2 of each of the solar cell units A may be oxide TFTs. That is, the semiconductor layers of the first transistor T1 and the second transistor T2 of each of the solar cell units A may be formed of an oxide semiconductor. The term "oxide semiconductor", as used herein, may indicate a compound including oxygen and one or more elements such as In, Ga, Zn, or Sn. The oxide semiconductor may be an amorphous oxide semiconductor or a crystalline oxide semiconductor. The amorphous oxide semiconductor may be IGZO, and the crystalline oxide semiconductor may be one of ZnO, IZO, IGO, ITO and InO. Oxide TFTs can be highly transparent and can thus transmit visible light therethrough. Not only the semiconductor layers, but also the rest of the first transistor T1 and the second transistor T2 of each of the solar cell units A, may be formed of a transparent material. As a result, the solar cell units A may be transparent.

The second substrate 220 may include a color filter layer 221 and an encapsulation layer 222.

The color filter layer 221 may include a plurality of color filters each representing at least one of red (R), green (G) and blue (B), and a black matrix BM defining the color filters. The color filters may be arranged to correspond to the pixels PX, respectively, on the first substrate 210. That is, the color filters may overlap the pixels PX, respectively. Backlight transmitted to the second substrate 220 through the pixels PX of the first substrate 210 may render the colors of the color filters by passing through the color filters. The black matrix BM may separate the color filters from one another, and may prevent or substantially prevent beams of light transmitted through the color filters from mixing.

The encapsulation layer 222 may be a transparent glass substrate, but the present invention is not limited thereto. That is, the encapsulation layer 222 may be a transparent plastic substrate. The encapsulation layer 222 may be located above the color filter layer 221. The encapsulation layer 222 may prevent or reduce infiltration of foreign materials, and may protect the display device 20 against any external impact.

The solar cell units A may overlap the pixels PX, respectively, of the first substrate 210. That is, the solar cell units A may be arranged to overlap the color filters, respectively, as illustrated in FIG. 10, but the present invention is not limited thereto. For example, the solar cell units A may be formed to overlap the black matrix BM. Because the solar cell units A are transparent, as mentioned above, the introduction of external light into the solar cell units A can be facilitated. Also, because the solar cell units A overlap the pixels PX, respectively, from which backlight is emitted, the solar cell units A can effectively convert external light into a current.

The solar cell units A may be located above the color filter layer 221. For example, as illustrated in FIG. 11, the solar cell units A may be formed between the color filter layer 221 and the encapsulation layer 222. A buffer layer 223 may be formed on the color filter layer 221, and the first transistor T1 of each of the solar cell units A may be formed on the buffer layer 223. Alternatively, the solar cell units A may be formed above the encapsulation layer 222. For example, as illustrated in FIG. 12, the buffer layer 223 may be formed on the encapsulation layer 222, and the first transistor T1 of each of the solar cell units A may be formed on the buffer layer 223. However, the present invention is not limited to the examples illustrated in FIGS. 11 and 12.

Another plurality of solar cell units A may be additionally provided in the pixels PX, respectively. That is, in addition to the solar cell units A included in the second substrate 220, another plurality of solar cell units A may be provided in the pixels PX, respectively, of the first substrate 210. In this example, the display device 20 can provide more current to the voltage generator than when the solar cell units A are provided only in the second substrate 220.

It will be understood that, although the terms "first," "second," "third," etc., may be used throughout the specification to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The timing controller, the data driver, the scan driver, the voltage generator and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present invention.

While the present invention has been particularly shown and described with reference to exemplary embodiments thereof, it will be understood by those of ordinary skill in the art that various changes in provide and detail may be made therein without departing from the spirit and scope of the present invention as defined by the following claims and their equivalents. The exemplary embodiments should be considered in a descriptive sense only and not for purposes of limitation.

What is claimed is:

1. A display device comprising a first pixel at a region defined by a first scan line and a first data line,
   wherein the first pixel comprises a switching transistor comprising a control terminal connected to the first scan line and an input terminal connected to the first data line, and is configured to be turned on by an on voltage of a scan signal from the first scan line;
   a first transistor comprising a first control terminal connected to the first scan line, a first input terminal connected to the first data line, and a first output terminal connected to the first control terminal; and a second transistor comprising a second control terminal connected to the first output terminal, a second input terminal configured to receive a base voltage, and a second output terminal connected to the second control terminal, wherein the first transistor is configured to convert light into a first current to be outputted to the first output terminal, in response to an off voltage of the scan signal, and wherein the second transistor is configured to convert light into a second current to be outputted to the second output terminal, in response to an off voltage of the scan signal.

2. The display device of claim 1, wherein the first pixel further comprises a third transistor comprising a third control terminal connected to the second output terminal of the second transistor, a third input terminal configured to receive a base voltage, and a third output terminal connected to the third control terminal.

3. The display device of claim 2, wherein the first transistor, the second transistor and the third transistor comprise oxide thin film transistors.

4. The display device of claim 1, further comprising a second pixel arranged side by side with the first pixel along an extending direction of the first scan line or an extending direction of the first data line, wherein the second pixel further comprises a third transistor comprising a third control terminal connected to the second output terminal of the second transistor, a third input terminal configured to receive a base voltage, and a third output terminal connected to the third control terminal.

5. The display device of claim 1, further comprising a second pixel which is not aligned with the first pixel along an extending direction of the first scan line or an extending direction of the first data line, wherein the second pixel further comprises a third transistor comprising a third control terminal connected to the second output terminal of the second transistor, a third input terminal configured to receive a base voltage, and a third output terminal connected to the third control terminal.

6. The display device of claim 1, wherein the first current is combined with the second current at the second output terminal.

7. The display device of claim 6, further comprising a voltage generator configured to generate and output a driving voltage for the first pixel, wherein the voltage generator is configured to receive the first current and the second current combined at the second output terminal.

8. The display device of claim 6, further comprising a third transistor comprising a third control terminal connected to the second output terminal of the second transistor, a third input terminal configured to receive a base voltage, and a third output terminal connected to the third control terminal, wherein the third transistor is configured to convert light into a third current to be outputted to the third output terminal, in response to an off voltage of the scan signal, and wherein the first current and the second current combined at the second output terminal are combined with the third current at the third output terminal.

9. The display device of claim 8, further comprising a voltage generator configured to generate and output a driving voltage for the first pixel, wherein the voltage generator is configured to receive the first current, the second current and the third current combined at the third output terminal.

10. The display device of claim 1, wherein the first transistor and the second transistor form one solar cell unit.

11. A display device comprising a first pixel at a region defined by a first scan line and a first data line, and a second pixel arranged side by side with the first pixel, wherein the first pixel comprises a switching transistor comprising a control terminal connected to the first scan line and an input terminal connected to the first data line, and is configured to be turned on by an on voltage of a scan signal from the first scan line; and a first transistor comprising a first control terminal connected to the first scan line, a first input terminal connected to the first data line, and a first output terminal connected to the first control terminal, wherein the second pixel comprises a second transistor comprising a second control terminal connected to the first output terminal, a second input terminal configured to receive a base voltage, and a second output terminal connected to the second control terminal, wherein the first transistor is configured to convert light into a first current to be outputted to the first output terminal, in response to an off voltage of the scan signal, and wherein the second transistor is configured to convert light into a second current to be outputted to the second output terminal, in response to an off voltage of the scan signal.

12. The display device of claim 11, wherein the first pixel and the second pixel are arranged along the first scan line.

13. The display device of claim 11, wherein the first pixel and the second pixel are arranged along the first data line.

14. The display device of claim 11, wherein the first pixel and the second pixel are not arranged along any of the first scan line and the first data line.

15. The display device of claim 11, further comprising a third pixel different from the first pixel and the second pixel, wherein the first pixel, the second pixel or the third pixel comprises a third transistor comprising a third control terminal connected to the second output terminal of the second transistor, a third input terminal configured to receive a base voltage, and a third output terminal connected to the third control terminal, wherein the third transistor is configured to convert light into a third current to be outputted to the third output terminal, in response to an off voltage of the scan signal.

16. The display device of claim 11, further comprising a voltage generator configured to generate and output a driving voltage for the first pixel, wherein the first current is combined with the second current at the second output terminal, and the voltage generator is configured to receive the first current and the second current combined at the second output terminal.

17. A display device comprising:
a first substrate comprising a plurality of pixels comprising a plurality of driving transistors; and
a second substrate facing the first substrate and arranged above the first substrate,
wherein the second substrate comprises at least one solar cell unit, wherein the at least one solar cell unit comprises a first transistor comprising a first control terminal, a first input terminal configured to receive a base voltage, and a first output terminal connected to the first control terminal, and a second transistor comprising a second control terminal connected to the first output terminal, a second input terminal configured to receive a base voltage and a second output terminal connected to the second control terminal, and wherein the first transistor and the second transistor comprise oxide semiconductors.

18. The display device of claim 17, wherein the second substrate comprises a color filter layer and an encapsulation layer, and the solar cell units are between the color filter layer and the encapsulation layer.

19. The display device of claim 17, wherein the second substrate comprises a color filter layer and an encapsulation layer, and the solar cell units are above the encapsulation layer.

20. The display device of claim 17, wherein the solar cell units overlap the pixels, respectively.

* * * * *